United States Patent [19]
Choudhury et al.

[11] Patent Number: 6,058,014
[45] Date of Patent: May 2, 2000

[54] ENHANCED MOUNTING HARDWARE FOR A CIRCUIT BOARD

[75] Inventors: Apurba Choudhury, Rochester; Miles F. Swain, Hayfield, both of Minn.

[73] Assignee: International Business Machines Corporation, Armonk, N.Y.

[21] Appl. No.: 09/170,102

[22] Filed: Oct. 13, 1998

[51] Int. Cl.[7] ............................... H05K 7/20; H05K 7/10
[52] U.S. Cl. .......................... 361/704; 257/719; 257/727; 361/768; 439/71; 439/331
[58] Field of Search ..................... 257/706–707, 257/712–713, 718–719, 726–727; 361/767–770, 820; 439/66, 71, 73, 331, 405, 487, 526

[56] References Cited

U.S. PATENT DOCUMENTS

| | | | |
|---|---|---|---|
| 5,221,209 | 6/1993 | D'Amico | 439/71 |
| 5,648,890 | 7/1997 | Lou et al. | 361/704 |
| 5,770,891 | 6/1998 | Frankeny et al. | 257/727 |

*Primary Examiner*—Gregory Thompson
*Attorney, Agent, or Firm*—Robert H. Berdo

[57] ABSTRACT

An enhanced electrical arrangement for a computer includes a circuit board, and a module arranged essentially parallel to the circuit board. An array connector is positioned between the circuit board and the module. The array connector causes the circuit board to be in electrical communication with the module. A clamping arrangement is provided for urging the circuit board and the module toward each other, by exerting a constant force against the module to cause an electrical connection between the circuit board, array connector and the module. The clamping arrangement includes an alignment assembly that is mounted to the circuit board to help align the module, and a load assembly to provide the force on the module. The alignment assembly and the load assembly are removably engageable with one another. When the load assembly is engaged with the alignment assembly, the load assembly can apply the force on the module which urges the module toward the array connector and the circuit board. Further, when the load assembly is disengaged from the alignment assembly, the force is removed from the module.

43 Claims, 7 Drawing Sheets

ENHANCED MOUNTING HARDWARE FOR A CIRCUIT BOARD

BACKGROUND OF THE INVENTION

1. Field of the Invention

The invention relates to enhanced mounting hardware for a circuit board, and in particular, to an enhanced mounting arrangement for securing a component, such as a module, to a circuit board.

2. Background Information

Circuit boards, such as those used in computers, for example, typically have various components, such as processor and memory modules connected to a surface thereof. The circuit boards are usually connected to a further circuit board, commonly referred to as a backplane, for example. The assembly of the backplane and the various circuit boards may be positioned within an open cage, which is a frame fixed within a computer housing. The cage serves to position the circuit boards within the computer housing.

Typically, the modules are connected to the circuit board in a permanent relationship by soldering the modules directly to the circuit board. This type of connection is a concern because of the reliability of the solder connection. For example, a poor electrical connection between devices may occur if the solder joint is too small, the solder joint has too much flux, or the solder joint is cracked. In addition, this type of permanent connection disadvantageously prevents the modules from being easily removed from the circuit board for repair or replacement purposes.

Alternatively, the modules can be connected to the circuit board using a pin-and-socket connector. However, this type of connection disadvantageously results in a relatively high impedance. As is known to those skilled in the art, a high impedance is undesirable, since this may reduce the signal strength between the circuit board and the associated module.

It is also known to use a so-called array connector in order to connect the modules to a circuit board. Such connectors typically include a relatively small, flat panel having a relatively large number of conductive pads formed thereon. The array connector is positioned between the circuit board and the associated module, with the conductive pads of the array connector being in registration with a like number of corresponding conductive pads located on both the circuit board and the module. The conductive pads of the array connector thus causes an electrical connection between conductive pads on the circuit board, and the module. In order to ensure an electrical connection between the circuit board and the module, the conductive pads of the array connector must be property aligned with the corresponding conductive pads of both the circuit board and the module. Moreover, a relatively large force needs to be applied. For example, a typical minimum force for a gold-to-gold contact is approximately 0.1 pound-per-contact. Therefore, for an exemplary array connector with 1024 conductive pads (i.e., contacts), a minimum force of approximately 110 pounds should be applied to hold the array connector between the circuit board and the module.

Typically, this force is generated through the use of a relatively large, expensive, complicated arrangement of springs and screws which are positioned at each of the four corners of the array connector. This type of arrangement disadvantageously has numerous separate parts. Thus, the known arrangement for securing an array connector to a circuit board may be difficult to use, due to its complexity.

Further, access to the springs and screws of the known arrangement may be limited, which is disadvantageous because the modules may need to be replaced or upgraded, on occasion. Therefore, there is a need for an arrangement for securing an array connector between a circuit board and a module, that is easy to use.

Further, the known arrangement makes it difficult to align the conductive pads of the array connector with the conductive pads of the circuit board and module. Thus, there is a need for an arrangement in which the conductive pads of the circuit board, module, and array connector (if provided) can be easily and precisely aligned.

In addition, during operation, the various electrical components located on the circuit boards, for example the processor modules, tend to consume a substantial amount of electrical power, and therefore tend to generate a substantial amount of heat. Because excess temperature can impair a computer system's reliability and functionality, the modules are often provided with heat sinks to help dissipate the generated heat. On some circuit boards, the heat sinks are provided in such a high density that nearly the entire surface of the circuit board is covered by heat sinks. Therefore, space is often at a premium, and the above-described arrangement of the springs and screws may not be feasible with certain circuit boards. Thus, there is a need for an arrangement that it is suitable for holding a module to a circuit board, even when the heat sinks are densely arranged.

Additionally, the conductive pads of the array connector will typically compress due to the applied force over a period of time. In the conventional arrangement, this will result in a reduction in the applied force, which may ultimately result in the electrical connection between the circuit board and the module failing. Thus, there is a need for a way to apply the necessary force to an array connector which will not diminish over time.

SUMMARY OF THE INVENTION

It is, therefore, a principle object of this invention to provide enhanced mounting hardware for a circuit board.

It is another object of the invention to provide enhanced mounting hardware for a circuit board that solves the above-mentioned problems.

These and other objects of the present invention are accomplished by the enhanced mounting hardware for a circuit board disclosed herein.

According to an exemplary embodiment of the present invention, a clamping arrangement can be utilized to electrically connect a module, such as a processor module or memory module, to a circuit board within a computer system, for example. Of course, the present invention is not limited to use with a module and/or a circuit board. To the contrary, the present invention can be used in any application that could benefit from a reliable clamping arrangement that utilizes a minimum amount of space, provides a relatively large clamping force, and/or is easy to use. For example, the clamping arrangement could additionally be used to hold a heat sink against a major surface of the module.

The clamping arrangement includes an alignment assembly used to align the module with a region of the circuit board, and in particular, used to ensure the respective conductive pads on the circuit board (i.e., an input/output region) are properly aligned with the corresponding conductive pads of the module. The clamping arrangement further includes a load assembly adapted to apply a force on the aligned module to urge the module toward the circuit board.

This arrangement advantageously ensures that the circuit board and module are in electrical communication.

Preferably, the alignment assembly and the load assembly are removably engageable with one another without the use of separate fasteners, such as screws or bolts. This exemplary arrangement advantageously holds the module and the circuit board together, in a simple and secure manner.

When the module is aligned with the circuit board using the alignment assembly, and when the load assembly is engaged with the alignment assembly, the load assembly can exert the force against the module, thus urging the module against the circuit board. Further, when the load assembly is disengaged from the alignment assembly, the force on the module will be removed. This arrangement allows the force on the module to be removed in a simple manner, so that the module can be removed, for replacement or upgrade purposes, for example.

Advantageously, the alignment assembly includes an alignment plate adapted to receive the module. The alignment plate is aligned with the input/output region of the circuit board, so that the module will likewise be aligned with the circuit board input/output region. The alignment plate is mounted to the circuit board, using for example, screws or rivets. This exemplary embodiment is a simple means of ensuring the module and the input/output region of the circuit board are in registration, prior to a force being applied.

Advantageously, the alignment plate has a plurality of recesses formed in the region of its outer perimeter to allow the alignment plate to be removably engaged with the load assembly. Preferably, each recess is in communication with a respective groove formed in the region of the outer perimeter. Each groove extends in a direction perpendicular to each respective recess, and parallel to the top and bottom major surfaces of the alignment plate. Likewise, the load assembly is adapted to engage with the alignment plate using the recesses and grooves. This arrangement advantageously allows the alignment plate to be engaged to the load assembly without requiring the alignment plate to have any additional components. Moreover, the recesses and grooves can be easily formed during the manufacturing process.

Preferably the alignment assembly will also include a base plate positioned adjacent to a back surface of the circuit board, and connected to the alignment assembly using, for example, screws that pass through the intervening circuit board. This arrangement advantageously provides support for the circuit board, and securely clamps the circuit board between the base plate and the load assembly. This allows a sufficient force to be generated, without relying on the circuit board for support.

Advantageously, the alignment assembly further includes an insulator plate positioned between the base plate and the circuit board. The insulator plate advantageously allows the base plate to be formed of a metal, such as steel, while electrically isolating the base plate from the back surface of the circuit board.

According to another exemplary embodiment of the present invention, an array connector may be positioned over and adjacent to the front major surface of the circuit board, and under the module. The array connector typically has a plurality of conductive pads protruding through both an upper and lower surface thereof, that are identical in number and pattern to the conductive pads of the module and circuit board. When the array connector is placed on the circuit board, the alignment plate ensures that the array connector is aligned with and in registration with the input/output region of the circuit board. Moreover, when the module is placed on the array connector, the alignment plate ensures that the module is aligned with and in registration with the array connector. Thus, the module, array connector, and circuit board will be in registration with each other through the alignment plate. As such, each conductive member of the array connector will be in electrical communication with both the module and the circuit board, when the load assembly is engaged with the alignment assembly.

Preferably, the load assembly includes a cover plate, and a load head that is adapted to provide the force on the module and/or heat sink. Advantageously, the cover plate may include a plurality of sidewalls, for example, two sidewalls and a top wall. The upper edge of the sidewalls may be connected to the top wall, and the lower edge of the sidewalls are preferably removably engageable with the alignment assembly. The load head may be attached to the top wall in such a manner that when the cover plate is engaged with the alignment assembly, the load head can provide the force on the module. Further, if only two sidewalls are used, a channel will be formed, so that air may advantageously be allowed to flow horizontally through the cover plate.

Preferably, the load head includes a shaft and a load plate. One end of the shaft is connected to the top wall of the cover plate. For example, the top wall may be provided with a through hole, with the shaft being slidably received within the through hole. In order to prevent the shaft from sliding out of the hole, an end of the shaft protruding above the top wall is adapted to receive a c-ring or pin, for example. The other end of the shaft is connected to the load plate. Further, advantageously, the load plate is sized and shaped in accordance with a configuration of the module or heat sink, for example. This will allow the force to be distributed over a predetermine area, thus preventing unnecessary force concentrations from being applied, which could otherwise damage the module, for instance.

Preferably, the load assembly includes a spring, such as a helical, compression-type spring, positioned to urge the load head toward the module, so as to apply the necessary force. The spring is preferably coaxially arranged over the shaft, with one end pressing against the top wall, and the other end pressing against the load plate. The shaft will have a length corresponding to a length of the spring, so that when the alignment assembly and cover plate are engaged, the load plate will advantageously exert a predetermined force on the module. Moreover, the spring will advantageously compensate for any compression of the conductive pads of the array connector, thus ensuring that the predetermined force will always be exerted against the array connector. As a result, a reliable electrical connection between the module and the circuit board can be maintained.

Preferably, the cover plate further includes a support plate arranged parallel, and superposed to, the top wall. The support plate advantageously provides extra support to the top wall, to ensure that the top wall has sufficient strength and rigidity to accommodate the forces generated by the spring.

Advantageously, the sidewalls are adapted to be removably engaged with the alignment plate. For example, the sidewalls may have a plurality of tabs connected to the lower edge, formed to correspond to a placement of the respective recesses, and which project toward a center of the cover plate. The number of tabs is preferably equal to the number of recesses formed in the outer perimeter of alignment plate. The cover plate may be engaged with the alignment plate by aligning the tabs with the corresponding recesses, moving the cover plate in a vertical direction, i.e., toward the alignment plate, then moving the cover plate in a direction, i.e., in a horizontal direction, that causes the respective tabs to enter the corresponding grooves. The tabs will thus be located within the grooves, thereby engaging the alignment plate with the cover plate. This arrangement advantageously locks the alignment plate to the cover plate using no separate fasteners.

Advantageously, the end of the shaft that protrudes above the top wall is adapted to engage with a tool. For example, a groove may be formed in the shaft. The tool can engage with the shaft via the groove, to allow the shaft to be raised in the vertical direction, thus removing the applied force from the module.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
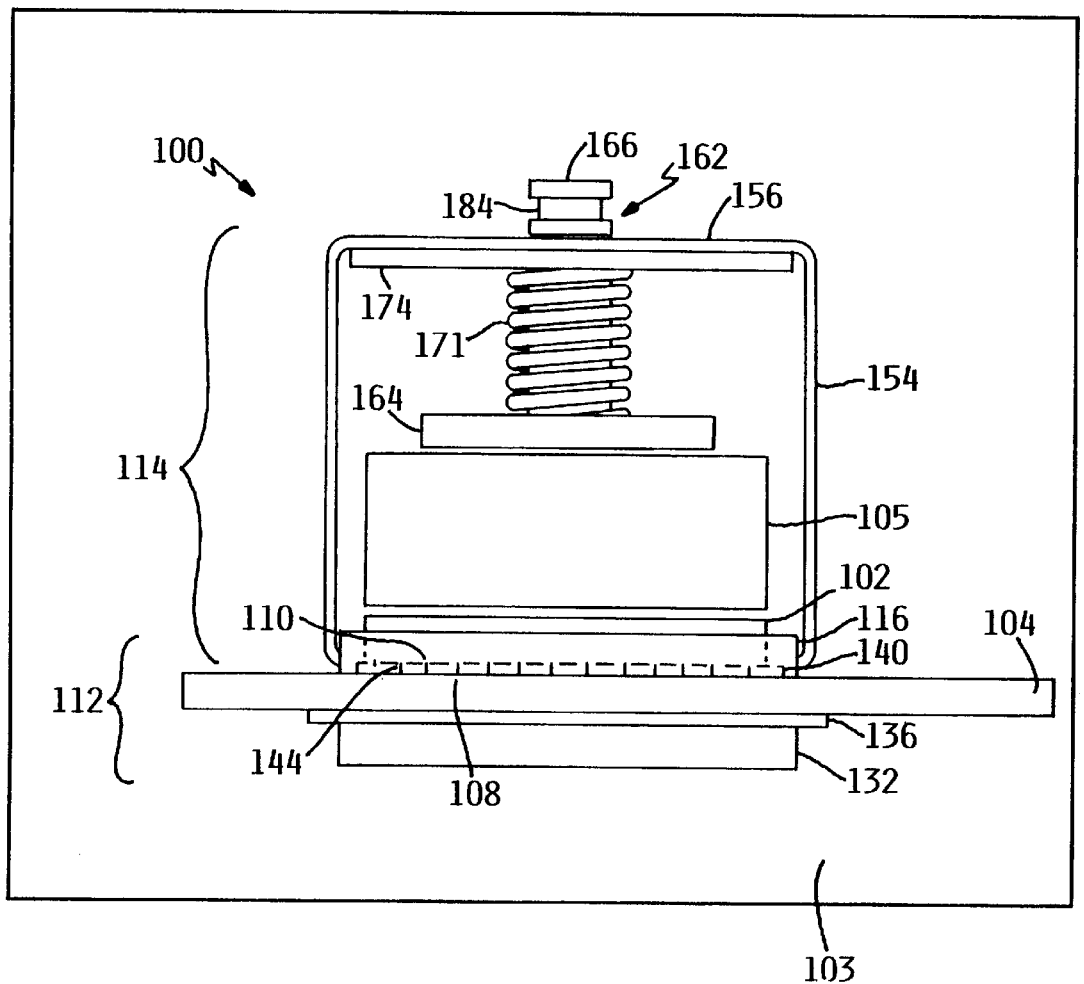
FIG. 1 is a front view of a clamping arrangement, according to an exemplary embodiment of the invention.

Referring to FIG. 1, an exemplary embodiment of a clamping arrangement 100 is shown. The clamping arrangement 100 can be utilized to electrically connect a module 102, such as a processor module or memory module, to a circuit board 104 disposed within a computer housing 103, for example. Of course, the present invention is not limited to use with a module and/or a circuit board. To the contrary, the present invention can be used in any application that could benefit from a reliable clamping arrangement that utilizes a minimum amount of space, provides a relatively large clamping force, and/or is easy to use. For example, in the exemplary embodiment shown in FIG. 1, the clamping arrangement 100 is additionally being used to hold a heat sink 105 against a major surface of the module 102. As will be appreciated, the clamping arrangement 100 could also be used solely for the purpose of holding the heat sink 105 in contact and in alignment with the module 102, for example. Alternatively, the clamping arrangement 100 can be used without the illustrated heat sink 105, for example.

Figure 2:
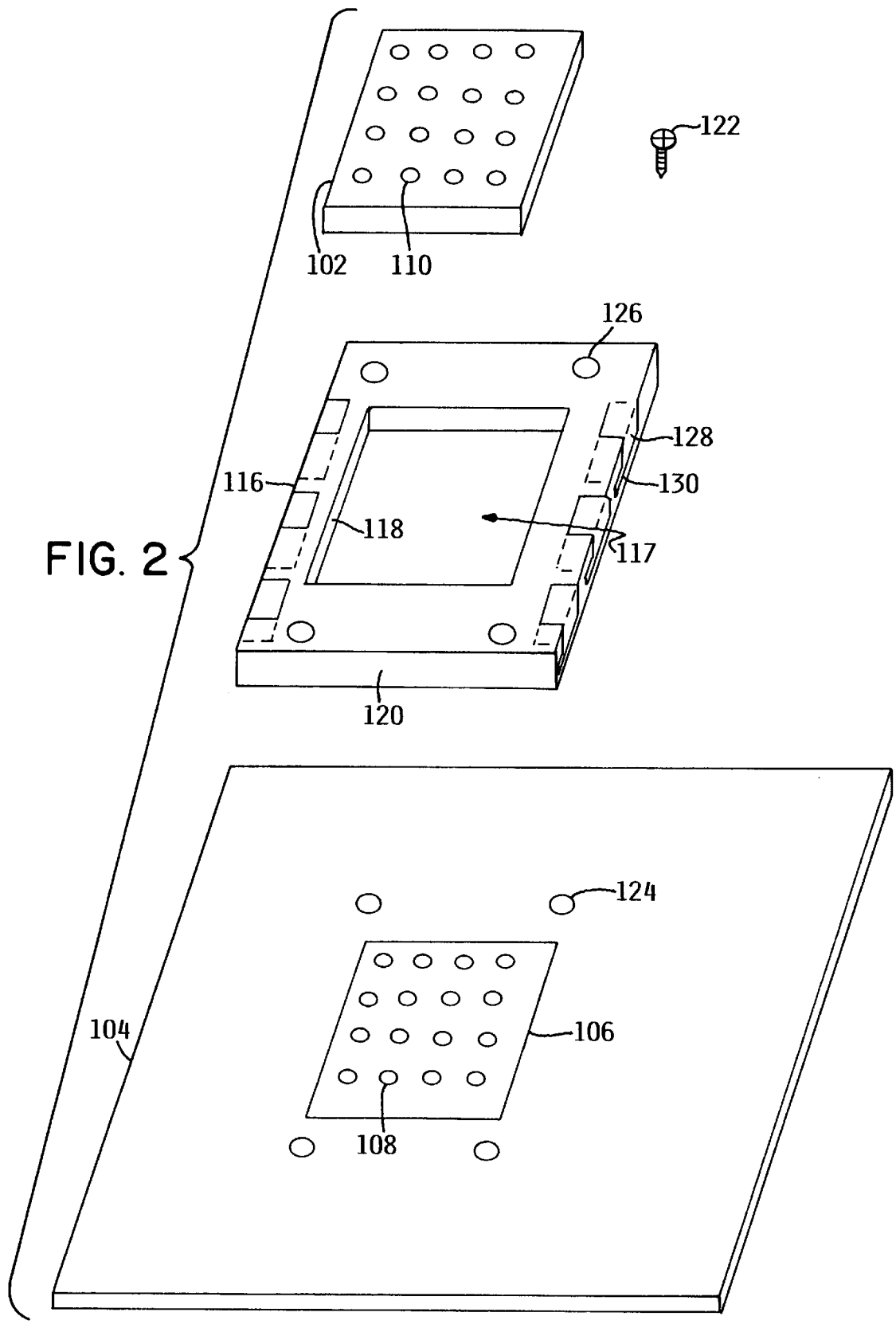
FIG. 2 is a perspective, exploded view of an alignment between a circuit board, alignment plate, and module, according to an exemplary embodiment of the present invention.

The module 102 and the circuit board 104 are best shown in FIG. 2. As shown in this figure, the circuit board 104 will have an input/output region 106 that is specifically tailored to communicate with the module 102. For example, both the input/output region 106 and the module 102 will be provided with an array of conductive pads 108, 110, that when coupled together, will allow the module 102 and the circuit board 104 to be in electrical communication. In the Figure, the module 102 is shown as being a relatively thin, rectangular-shaped plate. Of course, as will be appreciated, the module 102 may have other shapes, without departing from the spirit or scope of the present invention. Further, although the heat sink 105 (shown in FIG. 1) may be provided to dissipate heat generated by the module 102, if the module is a low power component that does not generate a substantial amount of heat, the use of the heat sink 105 may be unnecessary. Further, although the heat sink 105 is shown as being a separate component, it may also be possible to form the module and the heat sink as an integrally-formed discrete component.

Figure 3:
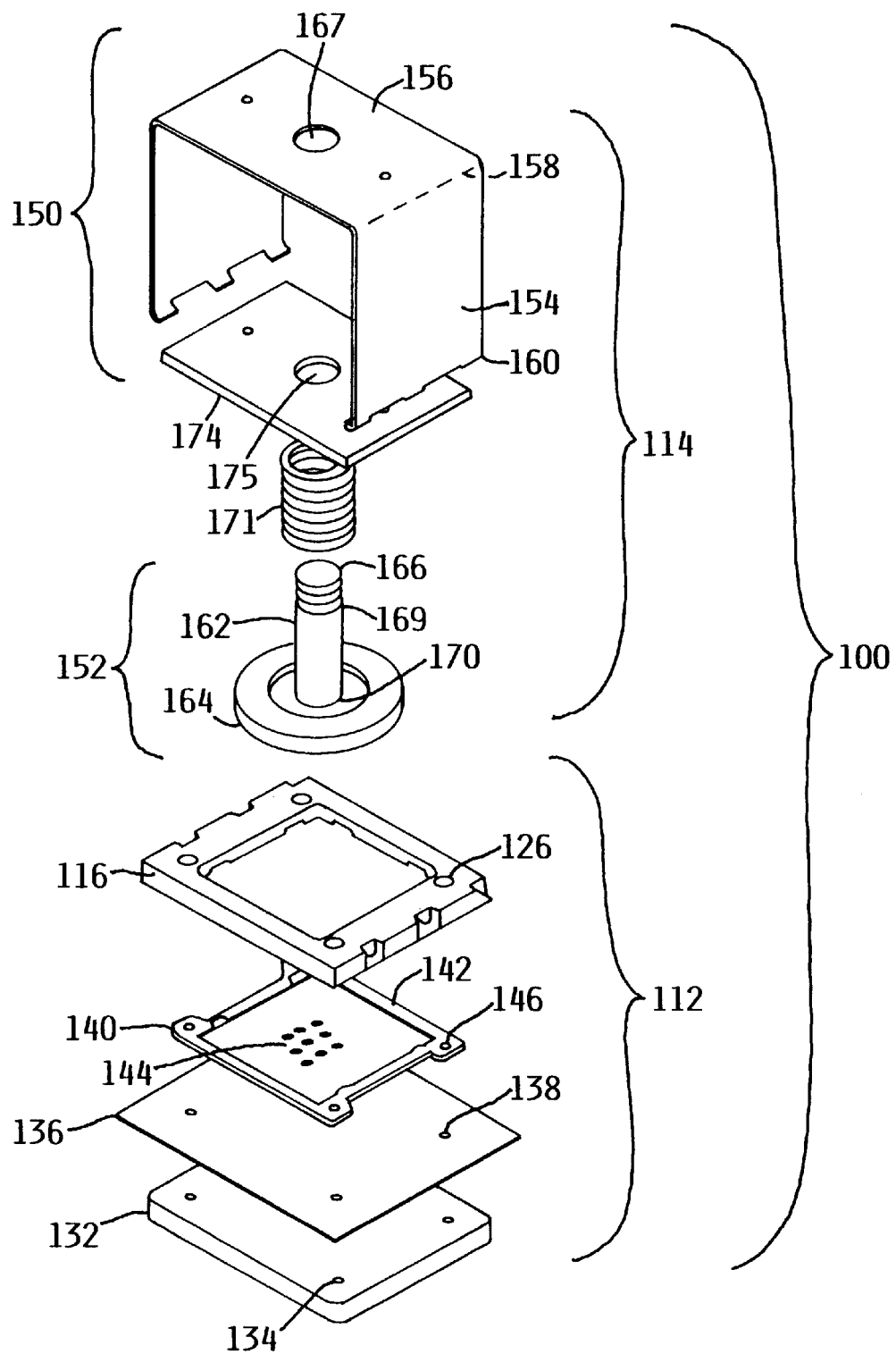
FIG. 3 is a perspective, exploded illustration of the clamping arrangement of FIG. 1 (but with the heat sink, module and circuit board being removed for clarity of illustration).

Referring also to FIG. 3, clamping arrangement 100 includes an alignment assembly 112 used to align the module 102 (not shown in this Figure) with the circuit board 104 (not shown in this Figure), and in particular, used to ensure the respective conductive pads 108 on the circuit board 104 are properly aligned with the corresponding conductive pads 110 of the module 102. The clamping arrangement 100 further includes a load assembly 114 adapted to apply a force on the aligned module 102 so to urge the module 102 toward the circuit board 104. This arrangement advantageously ensures that the circuit board and module are in electrical communication.

Figure 4:
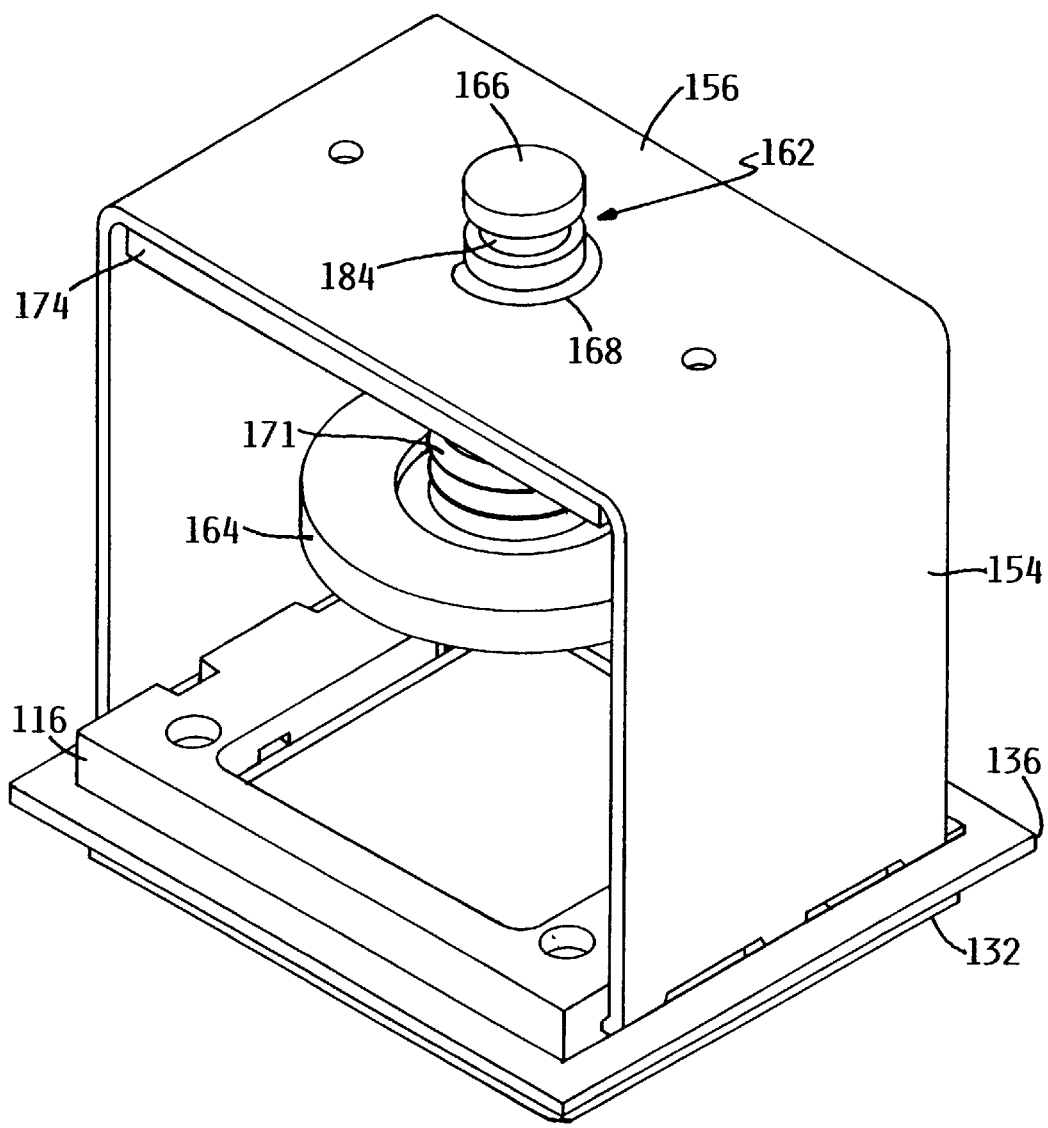
FIG. 4 is a perspective view of the clamping arrangement of FIG. 1 (but with the heat sink, module and circuit board being removed for clarity of illustration).

Preferably, the alignment assembly 112 and the load assembly 114 are removably engageable with one another without the use of separate fasteners, such as screws or bolts, as best shown in FIGS. 1, 3 and 4. As such, when the module 102 (shown only in FIG. 1) is aligned with the circuit board 104 using the alignment assembly 112, and when the load assembly 114 is engaged with the alignment assembly 112, the load assembly 114 can exert a force against the module 102 via the heat sink 105, for example, urging the heat sink 105 against the module 102, and urging the module 102 against the circuit board 104. Further, when the load assembly 114 is disengaged from the alignment assembly 112, the force on the module 102 and heat sink 105 will be removed. This exemplary arrangement advantageously holds the heat sink 105, module 102 and the circuit board 104 together, in a simple and secure manner. In addition, this arrangement allows the force on the module 102 and the heat sink 105 to be removed in a simple manner, so that the module 102 can be removed, for replacement or upgrade purposes, for example.

The alignment assembly 112 includes an alignment plate 116 (best shown in FIG. 2), that aligns the module conductive pads 110 with the corresponding circuit board conductive pads 108. The alignment plate 116 includes a through hole 117 for receiving the module 102 therein. The through hole is defined by an interior perimeter 118, which has essentially the same size and shape of the module 102. Moreover, the alignment plate 116 is shown as having essentially a rectangular, outer peripheral shape defined by an exterior perimeter 120. Of course, the alignment plate is not limited to a rectangular shape, but instead may be provided with one of a variety of shapes, without departing from the spirit and scope of the present invention. As used within this specification, the term "plate" connotes any member having either a flat and/or curved surface, with any type of profile.

Preferably, the alignment plate 116 is mounted to the circuit board 104 so that the interior perimeter 118 traces the outer edges of the circuit board input/output region 106. Thus, when the module 102 is placed in the through hole 117 of the alignment plate 116, the conductive pads 110 of the module 102 will be in registration with the conductive pads 108 of the circuit board 104.

Preferably, screws and/or rivets 122 are used to mount the alignment plate 116 to the circuit board 104. If screws or rivets 122 are used, the circuit board 104 and the alignment plate 116 may be provided with respective holes 124, 126 in registration with each other, for accommodating corresponding screws or rivets 122. By using screws and/or rivets 122, the alignment plate 116 can be mounted to the circuit board 104 in a relatively permanent relationship, thus reducing the possibility of any relative movement between the circuit board 104 and the alignment plate 116. Of course, the alignment plate 116 could be connected to the circuit board 104 using other means, such as by welding or soldering the alignment plate to the circuit board, or by using other types of fasteners.

Figure 5:
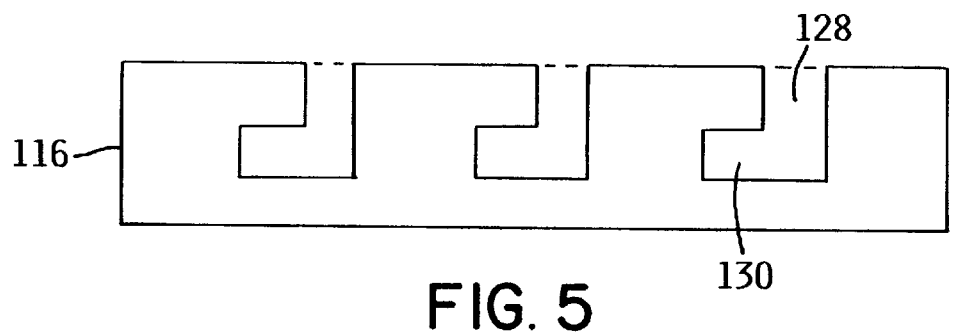
FIG. 5 is a side view of the alignment plate of FIG. 1.

Advantageously, the alignment plate 116 is removably engageable with the load assembly 114. Referring to FIGS. 2 and 5, a plurality of recesses 128 are preferably formed in the alignment plate 116 in a region of the outer perimeter 120. As shown, each recess 128 has a relatively rectangular profile (as viewed from the top of the alignment plate 116), and has a depth that extends from an upper surface of the alignment plate 116, toward a lower surface of the alignment plate. In the illustrated embodiment, the recesses 128 do not extend entirely through the alignment plate 116. However, the recesses 128 may have other shapes, and may be adapted to extend entirely through the alignment plate 116, without departing from the spirit and scope of the present invention.

Preferably, each recess 128 is in communication with a respective groove 130 formed in the alignment plate 116 in a region of the outer perimeter 120. As shown, each groove 130 extends in a direction perpendicular to each respective recess 128, and parallel to the top and bottom major surfaces of the alignment plate 116. The load assembly 114 (not shown in FIGS. 2 and 5) is adapted, in a manner that will be subsequently described, to engage with the alignment plate 116 using the recesses 128 and grooves 130.

Referring back to FIGS. 1 and 3, when the alignment assembly 112 and load assembly 114 are engaged, the load assembly 114 will provide a force on the module 102, urging the module against the circuit board 104. In order to prevent this applied force from damaging the circuit board 104, the alignment assembly 112 will preferably also include a base plate 132 positioned adjacent to a bottom major surface of the circuit board 104. The base plate 132 provides support for the circuit board 104. Moreover, this arrangement advantageously allows the module 102 and the circuit board 104 to be securely clamped between the base plate 132 and the load assembly 114, allowing a sufficient force to be generated, without relying on the circuit board 104 for structural support.

The base plate 132 is preferably roughly the same size and shape as the outer perimeter 120 of alignment plate 116, and is mounted to the circuit board 104 and alignment plate 116 using the aforementioned screws or rivets 122. If screws or rivets 122 are used, the base plate 132 may have holes 134 that are in registration with the circuit board holes 124 and alignment plate holes 126. By fastening the base plate 132 directly to the alignment plate 116 using screws or rivets 122, the base plate 132 can be accurately and easily aligned with the alignment plate 116. Moreover, since the screws or rivets 122 may pass through the circuit board 104 without directly engaging thereto, this arrangement will keep applied torsional forces against the circuit board 104 to a minimum, thus subjecting the circuit board 104 to only the compressional forces generated by the load assembly 114. However, as will be appreciated by those skilled in the art, the base plate 132 can also be connected in a variety of different ways, for example, by welding or soldering the base plate 132 to the circuit board 104. Moreover, although the base plate 132 is illustrated in the exemplary embodiment as being generally flat, with a rectangular configuration, the base plate 132 is not limited to this shape. Instead, the base plate 132 may be provided with one of a variety of shapes, as needed.

Advantageously, the alignment assembly 112 further includes an insulator plate 136 positioned between the base plate 132 and the circuit board 104. The insulator plate 136 advantageously allows the base plate 132 to be formed of a metal, such as steel, while electrically isolating the base plate 132 from the circuit board 104. Further, the exemplary embodiment shows the insulator plate 136 having holes 138 in registration with the base plate holes 134 so that the screws or rivets 122 can pass through the insulator plate 136 and into the base plate 132.

According to another exemplary embodiment of the present invention, and as best shown in FIGS. 1 and 3, the alignment assembly 112 may advantageously include an array connector 140 positionable over and adjacent to the input/output region 106 of the circuit board 104, and under the module 102. As best shown in FIG. 3, the array connector 140 includes a plate 142, which is typically comprised of a nonconductive material, such as plastic. The array connector 140 further includes an array of conductive pads 144 that extend through the plate 142 to project out from both major surfaces. Further, the conductive pads 144 will preferably be formed from a soft, conductive metal, such as gold. The number of conductive pads 144 in the array connector 140 are identical in number and pattern to the conductive pads 110, 108 of the module 102 and circuit board 104.

When the array connector 140 is placed on the circuit board 104, and when the module 102 is positioned over the array connector 140, each of the conductive pads 108 of the circuit board 104 will be in electrical communication with a corresponding conductive pad 110 of the module 102 via the respective conductive pads 144 of the array connector 140.

Advantageously, the array connector 140 can be positioned between the circuit board 104 and the alignment plate 116. For example, the array connector 140 may have essentially the same shape and size as the alignment plate 116, so that when the alignment plate is fastened to the base plate 132, an outer periphery portion of the plate 142 will be sandwiched between the alignment plate 116 and the circuit board 104, with the array of conductive pads 144 being positioned in alignment with the through hole 117. In this exemplary embodiment, the array connector 140 may be provided with holes 146 to allow screws or rivets 122 to pass therethrough. This configuration will allow the array connector 140 to be mounted to the circuit board 104, thus preventing the loss of this component. Alternatively, the array connector 140 can have essentially the same size and shape as the module 102, with both the array connector 140 and the module 102 being freely and removably positioned within the through hole 117.

As best shown in FIGS. 1 and 3, the load assembly 114 includes a load assembly 114 that is adapted to engage with the alignment plate 116. Further, the load assembly includes a load head 152 that is adapted to provide the force on the module 102 and/or heat sink 105, if so provided. The load head 152 is connected to the cover plate 150 in such a manner that when the cover plate 150 is engaged with the alignment plate 116, the load head 152 can provide the force on the module 102.

Advantageously, the cover plate 150 includes two parallel and spaced-apart upright sidewalls 154, and a top wall 156. The top wall 156 is connected to, and extends between the respective upper edges 158 of the sidewalls 154, to form a generally inverted U-shaped structure. Further, the lower edges 160 of the sidewalls 154 are engageable with the alignment plate 116, and the load head 152 is connected to the top wall 156, in a manner which will be subsequently described in more detail.

In this embodiment, since only two sidewalls 154 are used, the cover plate 150 forms a channel through which cooling air may flow. This arrangement advantageously helps to dissipate heat generated by the module 102. However, cover plate 150 can also have any suitable configuration that will allow it to be engaged with the alignment plate 116, and to have the load head 152 connected thereto. For example, the cover plate 150 may contain three or more sidewalls arranged in a pattern to coincide with the shape of the alignment plate 116. Alternatively, the sidewalls may be formed at an angle relative to each other, or arched, and connected together at their respective upper edges 158, thus eliminating the top wall 156, for example. Other arrangements are also possible within the scope of the invention.

Preferably, and as best shown in FIGS. 3 and 4, the load head 152 includes a shaft 162 and a load plate 164. One end 166 of the shaft 162 is connected to the top wall 156 of the cover plate 150. For example, in the illustrated embodiment, the top wall 156 is provided with a through hole 167 that has a diameter that is slightly greater than a diameter of the shaft 162. The end 166 of the shaft 162 protrudes through the hole 167 and above the top wall 156, so that the shaft is slidably received within the through hole 167 (see FIG. 4). In order to maintain the shaft 162 within the hole 167, i.e., to prevent the shaft from sliding out of the hole, the end 166 of the shaft 162 protruding above the top wall 156 is adapted to receive, for example, a c-ring 168 or pin (not shown) that is connected to the shaft 162. For example, the end 166 of the shaft could have a circumferentially-arranged groove 169 (FIG. 3) that receives the c-ring, so as to maintain the end of the shaft above the top wall 156. Of course, other ways of maintaining the shaft 162 in the through hole 167 are within the scope of the present invention.

An other end 170 of the shaft 162 is connected to the load plate 164. For example, the end 170 can be fastened to the load plate 164 using a mechanical fastener, welded to the load plate in a conventional manner, or formed with the load plate as an integral and discrete (and thus inseparable) component.

Although the load plate 164 is shown as being a flat, circular-shaped member, the load plate 164 can be any of a variety of shapes. For example, the load plate 164 can be adapted to provide the force directly to the module 102, i.e., without an intervening heat sink 105. In such an embodiment, the load plate 164 could be configured to apply the force only to the perimeter of the module 102 so as not to damage the module 102.

Preferably, and as best shown in FIG. 1, the cover plate 150 includes a spring 171, such as a helical, compression-type spring, positioned to urge the load plate 164 toward the module 102, so as to apply the necessary force. The spring 171 is preferably coaxially arranged over the shaft 162, with one end pressing against the top wall 156, and the other end pressing against the load plate 164. As shown, when the load assembly 114 is connected to the alignment assembly 112, the spring 171 (via the load plate 164) will urge the heat sink 105 toward the module 102, and will urge the module 102 toward the circuit board 104. Moreover, if an array connector 140 is provided, the spring 171 will urge the module 102 against the array connector 140, and will urge the array connector 140 against the circuit board 104.

As will be appreciated, the shaft 162 will have a length corresponding to length of the spring 171, so that when the alignment plate 116 and cover plate 150 are engaged, the load plate 164 will exert a predetermined force on the module 102.

Since the conductive pads 144 of the array connector 140 will permanently compress over time, the spring 171 will advantageously compensate for any compression of the conductive pads 144, thus ensuring that a predetermined force will always be exerted against the array connector 140. For example, the exemplary embodiment of the array connector described earlier had 1024 conductive members and therefore required a minimum force of approximately 110 pounds in order to ensure proper electrical contact. The spring 171 could thus be selected and configured to provide 110 pounds of force, for example. As a result, a reliable electrical connection between the module 102 and the circuit board 104 can be maintained.

While the preferred embodiment uses a helical spring 171, for example, the scope of the invention is not limited as such. To the contrary, other types of springs may be used in a similar manner. Alternatively, it may be possible to apply the force without using a spring at all. For example, the end of the shaft 162 could be threaded, and engaged with corresponding threads formed in the top wall 156. In order to generate the force, the shaft 162 could be rotated about its axis, with the threads causing the load plate 164 to move toward the module 102. Alternative arrangements are also within the scope of the present invention.

Preferably, and as best shown in FIG. 3, the cover plate 150 further includes a support plate 174 arranged parallel, and superposed to, the top wall 156. The support plate 174 advantageously provides extra support to the cover plate 150, to ensure that the cover plate 150 has sufficient strength and rigidity to accommodate the forces generated by spring 171. Preferably, the support plate 174 is provided with a through hole 175 that is in registration with through hole 167 of the top wall 156, to allow the end 166 of the shaft 162 to pass therethrough.

The support plate 174 may be physically connected to the lower surface of the top wall 156, using screws or rivets (not shown), for example. Alternatively, the support plate 174 can be connected in another manner, such as by welding or soldering, for example. Of course, it may also be possible to form the entire cover plate 150 of a material (such as steel) having an increased thickness, so as to eliminate the need for the support plate. However, as will be appreciated, this will likewise increase the thickness (and hence the weight, cost and size) of the sidewalls 154, which may be unnecessary.

Figure 6:
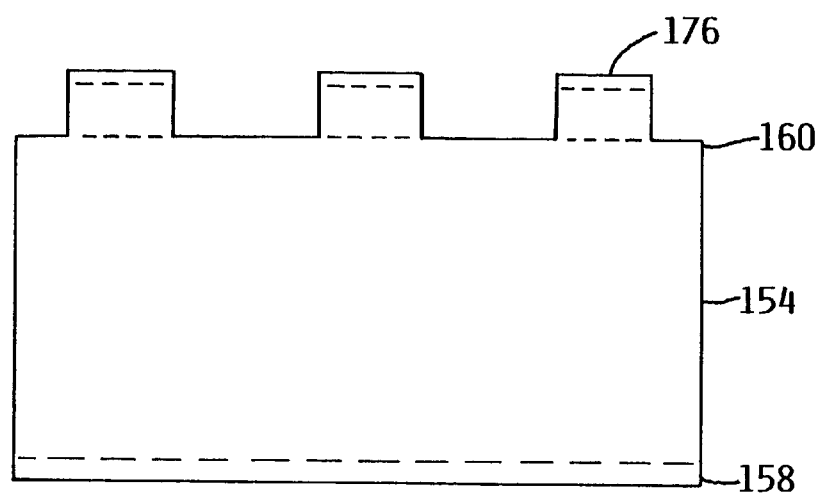
FIG. 6 is a side view of the cover plate of FIG. 1.
Figure 7:
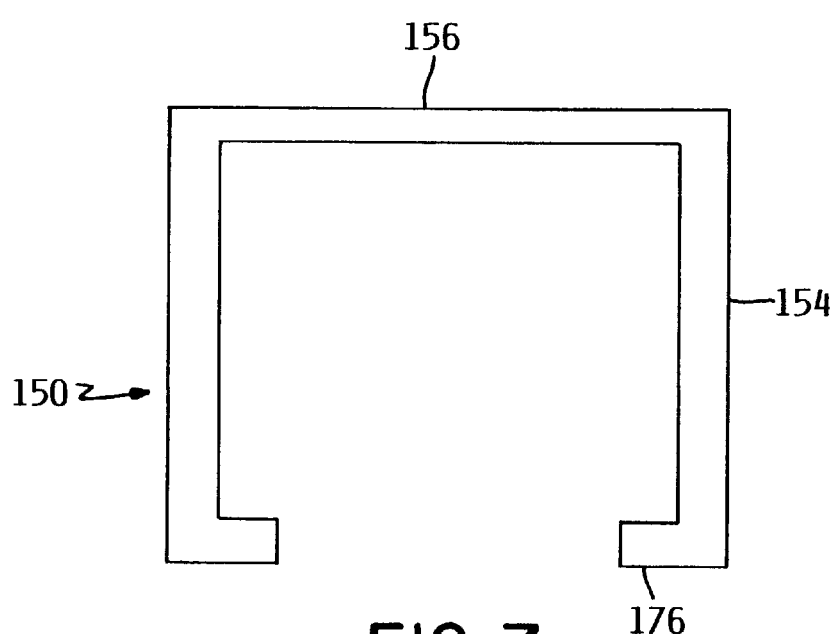
FIG. 7 is a front view of the cover plate of FIG. 1.

As discussed earlier, advantageously the sidewalls 154 are adapted to be removably engaged with the alignment plate 116. Referring also to FIGS. 6 and 7, the sidewalls 154 are illustrated as having a plurality of tabs 176 connected to the lower edge 160. The number of tabs 176 is preferably equal to the number of recesses 128 formed in the outer perimeter 120 of alignment plate 116 (shown in FIG. 5). As best shown in FIGS. 5 and 6, the tabs 176 are formed to correspond to a placement of the respective recesses 128, and preferably project toward a center of the cover plate 150, i.e., in a direction essentially perpendicular to the sidewalls 154 (see FIG. 7).

The cover plate 150 is engaged with the alignment plate 116 by aligning the tabs 176 with the corresponding recesses 128. The cover plate 150 is then moved in a vertical direction, i.e., toward the alignment plate 116, so that each tab 176 is set within a respective corresponding recess 128. The cover plate 150 is then moved in a direction, i.e., in a horizontal direction, that causes the respective tabs 176 to enter the corresponding grooves 130. The tabs 176 will thus be located within the grooves 130, thereby engaging the alignment plate 116 with the cover plate 150.

Figure 8:
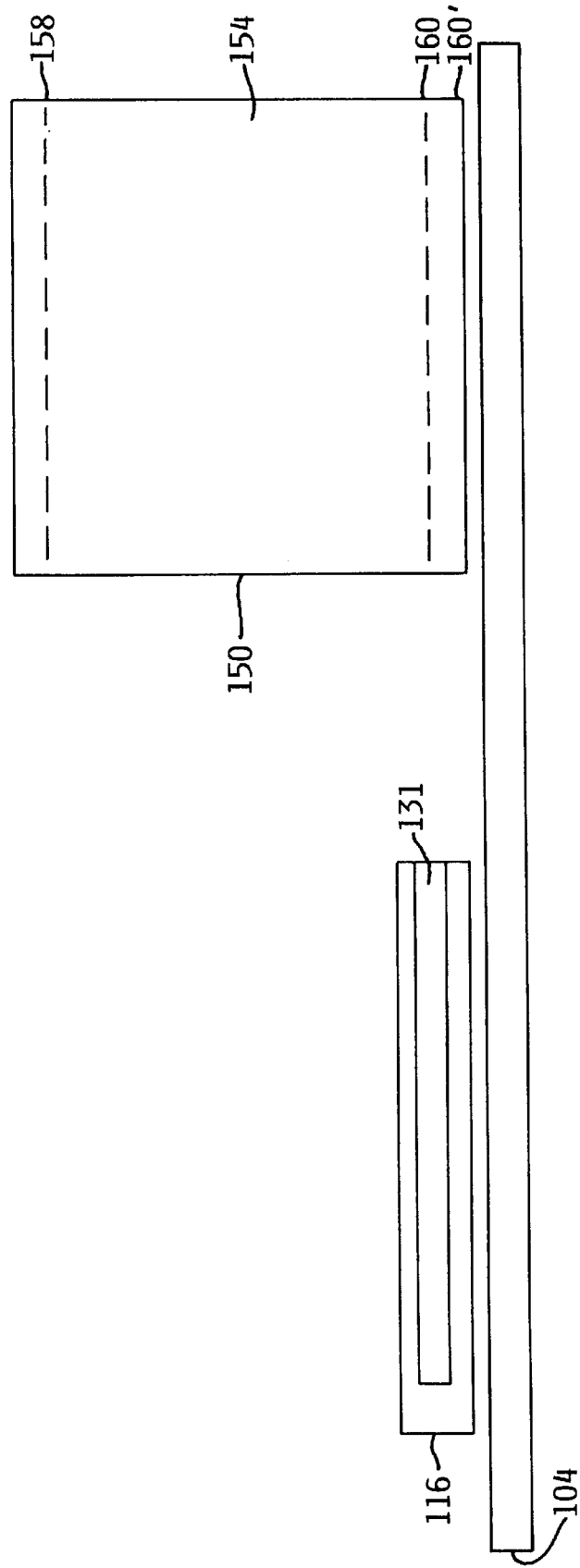
FIG. 8 is a side view of an alternative exemplary embodiment of the alignment plate and cover plate of FIG. 1.

It should be noted that while FIGS. 5 through 7 illustrate a plurality of tabs 176, recesses 128 and grooves 130, located on each side of the respective cover plate 150 and alignment plate 116, the invention is not limited to this configuration. For example, and as shown in FIG. 8, the alignment plate 116 could have only one groove 131 that extends along the respective sides of the alignment plate 116. As shown, instead of providing recesses that communicate with the groove 131, access to the groove could be obtained by extending the groove all the way to one corner of the alignment plate 116. Likewise, the sidewalls 154 could have only one respective tab for engaging with the respective groove 131. For example, the entire lower edge 160' of the respective sidewalls 154 could be formed to project inward. The lower edge 160' could then be slid into the groove 131. Of course, as will be appreciated, this configuration will require more free space adjacent to the alignment plate 116 than the previously-described embodiment, so as to allow the lower edge 160' to be slid into the groove 131 at the open end.

When the load assembly 114 is engaged with the alignment assembly 112, with the load plate 164 pressing against either the heat sink 105 or module 102, for example, due to the force of the spring 171, cover plate 150 will be urged in a direction away from the alignment assembly 112. This will cause the tabs 176 to frictionally engage with the corresponding grooves 130, thus securely holding the load assembly 114 in engagement with the alignment assembly 112. Once the force of the spring 171 is removed, so that the load plate 164 no longer presses against the heat sink 105 and/or module 102, the frictional engagement between the tabs 176 and the grooves 130 will be substantially reduced, allowing the load assembly 114 to be easily removed from the alignment assembly 112.

Figure 9:
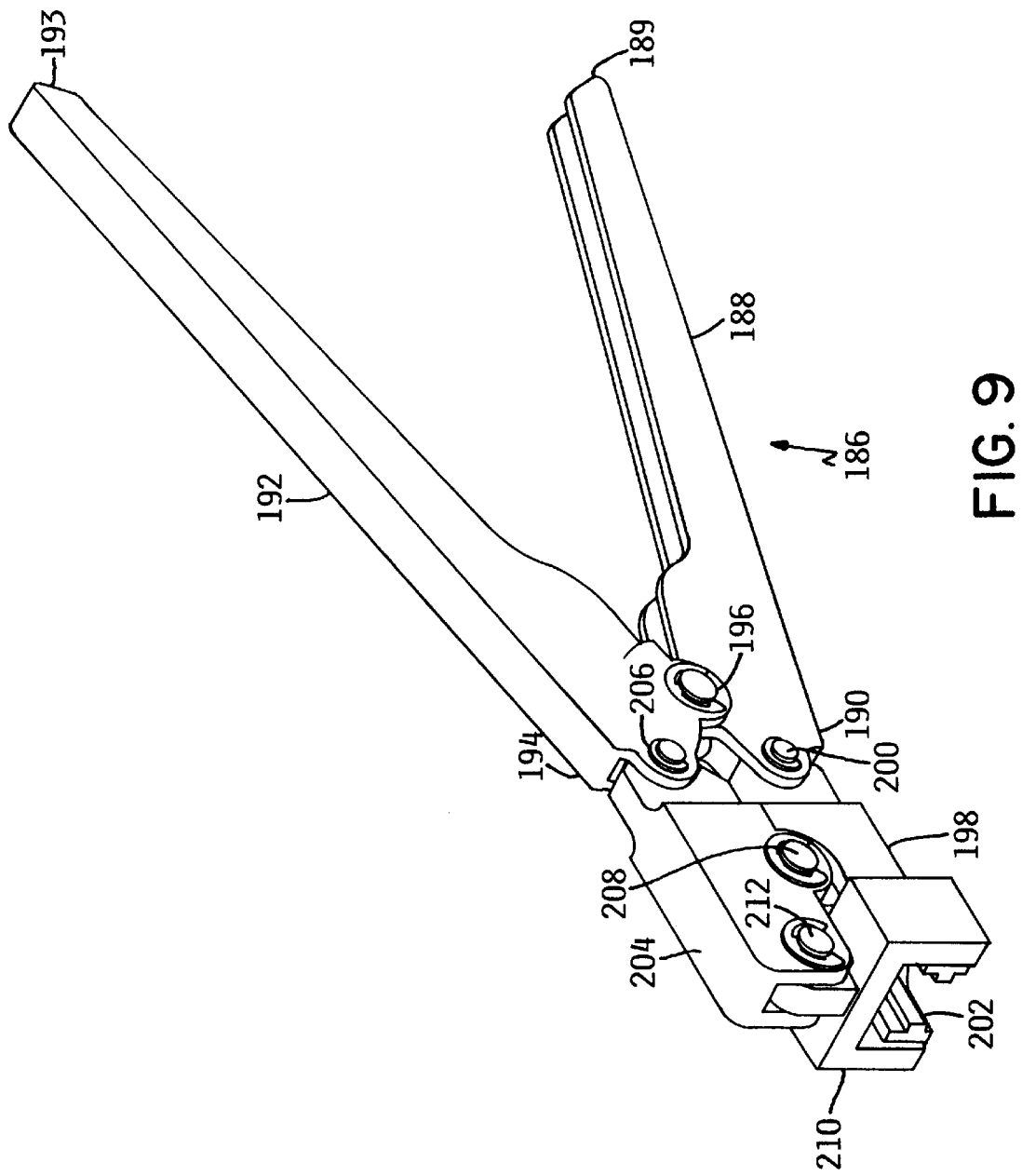
FIG. 9 is a perspective view of a clamping tool, used to engage with the clamping arrangement of FIG. 1.

Advantageously, and as best shown in FIG. 4, the end 166 of the shaft 162 that protrudes above the top wall 156 is adapted to engage with a tool 186, such as is shown in FIG. 9. For example, a groove 184 may be formed in the shaft 162. The tool 186 can engage with the shaft 162 via the groove 184, and raise the shaft 162 in the vertical direction, thus removing the applied force from the module 102 (or heat sink 105). Of course, as will be appreciated, the shaft 162 could be modified in numerous other ways that would enable a tool to grasp the shaft 162, without departing from the spirit and scope of the present invention.

Referring to FIG. 9, the tool 186 has a lower handle 188 and an upper handle 192. Each handle has a gripping end 189, 193 and an inner end 190, 194. The handles 188, 192 are connected to each other at a first pivot point 196, located between the griping end 189, 193 and the inner end 190, 194 of each handle. A spring (not shown) may be located in a region of the first pivot point 196.

A lower jaw 198 is connected to the inner end 190 of the lower handle 188 at a second pivot point 200. The lower jaw 198 is adapted to engage with the shaft 162. For example, the lower jaw 196 may include a lip 202 that fits into the groove 184 formed in the shaft 162.

An upper jaw 204 is connected to the inner end 194 of the upper handle 192 at a third pivot point 206. The upper jaw 204 and lower jaw 198 are connected to each other at a fourth pivot point 208. A support cover 210 is pivotably connected to the upper jaw 204 at a fifth pivot point 212.

To raise the shaft 162 in the vertical direction to remove the force on the module 102 (or heat sink 105), the lower jaw 198 of the tool 186 is slid onto the shaft 162, so that the lip 202 of the lower jaw 198 engages with the groove 184 in the shaft 162. The gripping ends 189, 193 of the handles 188, 192 are then squeezed together (activated), with the first pivot point 196 causing the inner ends 190, 194 of the handles to separate. The second and third pivot points 200, 206 cause respective ends of the lower and upper jaws 198, 204 to move away from each other, and the fourth pivot point 208 causes the other ends of the lower jaw 198 and the upper jaw 204 to move toward each other. The support cover 210 holds the upper jaw 204 at a fixed height, which causes the lower jaw 198 to move upward toward the upper jaw 204, thus lifting the shaft 162.

To lower the shaft 162, so as to reexert the force, the pressure on the gripping end 189, 193 of the handles 188, 192 is removed (deactivated).

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptive to various modifications, changes, and adaptations, and the same are intended to be comprehended within the meaning and range of equivalents of the appended claims.

What is claimed is:

1. A clamping arrangement, comprising:
    an alignment plate having a through hole formed therein, the hole being adapted to receive a component and being adapted to align the component relative to a region of a circuit board, the alignment plate having an outer edge and at least one groove formed in, and extending in a direction parallel to, the outer edge; and
    a load assembly removably engagable with said alignment plate via the at least one groove, and including means for exerting a force against the component to urge the component against the circuit board when said alignment plate and said load assembly are engaged with one another.

2. The clamping arrangement of claim 1, wherein the force additionally causes said alignment plate to frictionally and fixedly engage with said load assembly.

3. The clamping arrangement of claim 1, wherein said alignment plate is adapted to be mounted to a major surface of the circuit board.

4. The clamping arrangement of claim 3, further comprising a base plate adapted to be mounted to another major surface of the circuit board and in registration with said alignment plate.

5. The clamping arrangement of claim 4, further comprising an insulator plate positioned adjacent to said base plate and between said alignment plate and said base plate.

6. The clamping arrangement of claim 5, further comprising an array connector positioned adjacent to said alignment plate and between said alignment plate and said insulator plate.

7. The clamping arrangement of claim 1, wherein said load assembly further comprises a cover plate; and wherein said means includes a load head connected to said cover plate and being adapted to engage with the component.

8. The clamping arrangement of claim 7, wherein said load head includes:
a load plate adapted to press against the component, and
a shaft having a first end movably connected to said cover plate, and having a second end fastened to said load plate.

9. The clamping arrangement of claim 8, wherein said load head further comprises means connected to said shaft for generating and maintaining the force on the component.

10. The clamping arrangement of claim 8, wherein said cover plate includes a plurality of sidewalls connectable to said alignment plate, and a top wall connected to a respective upper edge of each of the plurality of sidewalls, said top wall having a through hole, with the first end of said shaft protruding through the through hole and above said top wall.

11. The clamping arrangement of claim 10, wherein said shaft further includes means for maintaining the first end of said shaft above said top wall.

12. The clamping arrangement of claim 10, wherein each of said sidewalls has at least one tab at a lower edge thereof, said tabs projecting toward a center of said cover plate so as to be essentially parallel to said top wall, said tabs engaging with said alignment plate to hold said alignment plate and said load assembly together.

13. The clamping arrangement of claim 10, wherein said load assembly further includes a support plate fastened to said top wall, and having a through hole that is aligned with the through hole in said top wall.

14. The clamping arrangement of claim 8, wherein said shaft includes means for accommodating a tool adapted to remove the force exerted against the component.

15. The clamping arrangement of claim 9, wherein said means for generating and maintaining comprises a compression spring coaxially arranged over said shaft, and having a first end pressing against said cover plate, and a second end pressing against said load plate.

16. A method of clamping a module to a circuit board, which comprises utilizing the clamping arrangement of claim 1.

17. The clamping arrangement of claim 1, wherein said load assembly further comprises a cover plate; and wherein said means includes a load head connected to said cover plate and being adapted to engage with the component, said load head including a spring in engagement with said cover plate, said spring generating and maintaining the force on the component.

18. The clamping arrangement of claim 17, wherein said spring comprises a compression spring.

19. The clamping arrangement of claim 17, wherein said load head includes a shaft having an end movably connected to said cover plate, said spring urging said shaft in a direction toward said alignment plate.

20. The clamping arrangement of claim 19, wherein said load head further comprises a load plate fastened to a further end of said shaft.

21. The clamping arrangement of claim 19, wherein said spring comprises a compression spring coaxially arranged over said shaft.

22. The clamping arrangement of claim 21, wherein said compression spring has a first end pressing against said cover plate, and a second end urging said shaft in the direction toward said alignment plate.

23. The clamping arrangement of claim 22, wherein said load head further comprises a load plate fastened to a further end of said shaft, the second end of said spring pressing against said load plate to urge said load plate and said shaft in the direction toward said alignment plate.

24. The clamping arrangement of claim 1, wherein said load assembly further comprises a cover plate having at least one tab at a lower edge thereof, said at least one tab being insertable into the at least one groove to hold said alignment plate and said load assembly together.

25. The clamping arrangement of claim 24, wherein said cover plate includes a plurality of sidewalls joined together, each of said sidewalls having at least one of said at least one tabs at a lower edge thereof.

26. The clamping arrangement of claim 25, wherein said means includes a shaft movably connected to said cover plate.

27. The clamping arrangement of claim 26, wherein said cover plate includes a top wall connecting said plurality of sidewalls together, said top wall having a through hole, with an end of said shaft protruding through the through hole and above said top wall.

28. The clamping arrangement of claim 25, wherein said tabs project in a direction essentially perpendicular to the respective lower edges of said sidewalls.

29. A clamping arrangement, comprising:
an alignment plate having a through hole formed therein, the hole being adapted to receive a component and being adapted to align the component relative to a region of a circuit board, said alignment plate having a plurality of recesses and a plurality of grooves, formed in an outer edge thereof, each of the grooves being in communication with a respective recess and each extending in a direction perpendicular to the respective recess, and
a load assembly removably engagable with said alignment plate via the plurality of recesses and the plurality of grooves, and including means for exerting a force against the component to urge the component against the circuit board when said alignment plate and said load assembly are engaged with one another.

30. The clamping arrangement of claim 29, wherein
said alignment plate is adapted to be mounted to a major surface of the circuit board; said clamping arrangement further comprising:
a base plate adapted to be mounted to another major surface of the circuit board and in registration with said alignment plate;
an insulator plate positioned adjacent to said base plate and between said alignment plate and said base plate; and
an array connector positioned adjacent to said alignment plate and between said alignment plate and said insulator plate; and wherein said load assembly comprises:
a cover plate which includes:
a plurality of sidewalls, each having at least one tab at a lower edge thereof, said tabs projecting toward a center of said cover plate, and each being engagable with a respective groove via a corresponding recess;
a top wall connected to a respective upper edge of each of said plurality of sidewalls, said top wall having a through hole; and a support plate fastened to said top wall, and having a through hole that is aligned with the through hole in said top wall; and wherein said means includes:
a load plate adapted to press against the component;
a shaft having a first end protruding through the hole in said top wall and through the hole in said support plate, said shaft further having means for maintaining the first end of said shaft above said top wall, and having means for accommodating a tool adapted to remove the force exerted against the component, said shaft further having a second end fastened to said load plate; and
a compression spring coaxially arranged over said shaft, and having a first end pressing against said support plate, and a second end pressing against said load plate.

31. A computer, comprising:
a computer housing; and
an enhanced electrical arrangement located within said computer housing, including:
a circuit board having an input/output region;
a module in electrical communication with the input/output region; and
a clamping arrangement for exerting a force to hold and urge said module against the input/output region, and including:
an alignment assembly having:
an alignment plate, mountable to a major surface of said circuit board and having a through hole formed therein, the module being receivable within the hole so as to be aligned relative to the input/output region of the circuit board, said alignment plate further having a plurality of recesses and a plurality of grooves formed in an outer edge thereof, each groove being in communication with a respective recess, and each groove extending in a direction perpendicular to the respective recess;
a base plate mountable to another major surface of said circuit board and in registration with said alignment plate;
an insulator plate positioned adjacent to said base plate and between said circuit board and said base plate; and
an array connector positioned adjacent to said alignment plate and between said alignment plate and said circuit board; and
a load assembly having:
a cover plate including:
a plurality of sidewalls each having at least one tab at a lower edge thereof, said tabs projecting toward a center of said cover plate and each being engagable with a respective groove via a corresponding recess;
a top wall connected to a respective upper edge of said plurality of sidewalls, said top wall having a through hole; and
a support plate fastened to said top wall, and having a through hole that is aligned with the through hole in said top wall; and wherein said means includes:
a load plate adapted to press against said module;
a shaft having a first end protruding through the hole in said top wall and through the hole in said support plate, said shaft further having means for maintaining the first end of said shaft above said top wall, and having means for accommodating a tool adapted to remove the force exerted against said module, said shaft further having a second end fastened to said load plate; and
a compression spring coaxially arranged over said shaft, and having a first end pressing against said support plate, and a second end pressing against said load plate.

32. The computer of claim 31, wherein the enhanced electrical arrangement further includes a heat sink positioned on a major surface of said module, wherein said load plate exerts a constant force on said heat sink urging said heat sink against said module, urging said module against said array connector, and urging said array connector against said circuit board when said sidewalls and said alignment plate are engaged with one another.

33. A method for aligning and clamping a component with a circuit board, comprising:
mounting an alignment plate adjacent to, and in registration with an input/output region of a circuit board;
positioning a component within an opening located in the alignment plate so as to be in communication with, and in registration with, the input/output region;
connecting a load assembly with the alignment plate by engaging the load assembly with at least one groove formed in, and extending in a direction parallel to, an outer edge of the alignment plate; and
exerting a constant force on the component using the load assembly so as to urge the component against the input/output region.

34. The method of claim 33, further comprising positioning an array connector beneath the component, in contact with, and in registration with the input/output region, wherein said positioning a component includes positioning the component in registration with the array connector.

35. The method of claim 33, further comprising positioning a base plate adjacent to a back surface of the circuit board, and in registration with the alignment plate.

36. The method of claim 35, further comprising positioning an insulator plate adjacent to the base plate and between the circuit board and the base plate.

37. The method of claim 33, wherein said connecting includes:
engaging a tool with a shaft of the load assembly;
activating the tool to lift the shaft in a vertical direction and against a force of a spring; and
positioning the load assembly relative to the alignment plate; and wherein said exerting includes:
deactivating the tool to allow the force of the spring to lower the shaft so the shaft exerts the constant force on the component, the force additionally causing the alignment plate to frictionally and fixedly engage with the load assembly.

38. The method of claim 33, further comprising positioning a heat sink on the component, wherein said exerting a constant force exerts the force against the heat sink so as to urge the heat sink against the component, and urge the component against the input/output region.

39. A clamping arrangement, comprising:
a load assembly including a cover plate that is adapted to cover a component, and a load head connected to and substantially covered by said cover plate, said load head including a shaft having a first end movably connected to said cover plate, and a second end movable in a direction toward the component, said load head further having a compression spring coaxially arranged over said shaft and having a first end pressiing against said cover plate, and a second end urging said shaft in the direction toward the component to generate and maintain a force on the component.

40. The clamping arrangement of claim 39, further comprising an alignment plate connected to said load assembly and having means for aligning the component.

41. The clamping arrangement of claim 39, wherein said load head further comprises a load plate fastened to the second end of said shaft.

42. The clamping arrangement of claim 39, wherein said load head further comprises a load plate fastened to the second end of said shaft, the second end of said spring pressing against said load plate to urge said load plate against the component.

43. A method for aligning and clamping a component with a circuit board, comprising:

mounting an alignment plate adjacent to, and in registration with an input/output region of a circuit board;

positioning a component within an opening located in the alignment plate so as to be in communication with, and in registration with, the input/output region;

connecting a load assembly with the alignment plate by engaging the load assembly with a plurality of grooves via a plurality recesses, the plurality of grooves and the plurality of recesses being formed in an outer edge of the alignment plate, each of the grooves being in communication with a respective recess and each extending in a direction perpendicular to the respective recess; and exerting a constant force on the component using the load assembly so as to urge the component against the input/output region.

* * * * *